(12) United States Patent
Ryu

(10) Patent No.: US 11,189,749 B2
(45) Date of Patent: Nov. 30, 2021

(54) TRANSFER APPARATUS AND TRANSFER METHOD FOR TRANSFERRING LIGHT EMITTING DIODE CHIP

(71) Applicant: QMC. INC., Anyang-si (KR)

(72) Inventor: Beng So Ryu, Incheon (KR)

( * ) Notice: Subject to any disclaimer, the term of this patent is extended or adjusted under 35 U.S.C. 154(b) by 186 days.

(21) Appl. No.: 16/434,177

(22) Filed: Jun. 7, 2019

(65) Prior Publication Data

US 2019/0296182 A1   Sep. 26, 2019

Related U.S. Application Data

(63) Continuation of application No. PCT/KR2019/002842, filed on Mar. 12, 2019.

(30) Foreign Application Priority Data

| Mar. 12, 2018 | (KR) | 10-2018-0028820 |
| Mar. 12, 2018 | (KR) | 10-2018-0028856 |
| Mar. 12, 2018 | (KR) | 10-2018-0028864 |

(51) Int. Cl.
  *H01L 33/00*  (2010.01)
  *H01L 21/687* (2006.01)
  *H01L 21/677* (2006.01)

(52) U.S. Cl.
  CPC .......... *H01L 33/005* (2013.01); *H01L 21/677* (2013.01); *H01L 21/68714* (2013.01)

(58) Field of Classification Search
  CPC ............ H01L 33/005; H01L 21/68714; H01L 21/677; H01L 2221/68322; H01L 2224/75702; H01L 2224/757; H01L 2224/7598; H01L 2224/80006; H01L 24/08; H01L 2224/08225; H01L 24/97; H01L 24/80; H01L 2224/97; H01L 2221/68368; H01L 2224/75901; H01L 2924/12041; H01L 2224/75301;
  (Continued)

(56) References Cited

U.S. PATENT DOCUMENTS

2005/0205204 A1\* 9/2005 Kurosawa ......... H01L 21/67132
  156/716
2008/0060750 A1\* 3/2008 Wang .................. G06K 19/077
  156/238

FOREIGN PATENT DOCUMENTS

| JP | 2003028974 A | 1/2003 |
| JP | 2004030443 A | 1/2004 |
(Continued)

*Primary Examiner* — Robert G Bachner
(74) *Attorney, Agent, or Firm* — Jongkook Park

(57) ABSTRACT

A transfer apparatus for transferring a plurality of light emitting diode chips, comprising a stage on which a first substrate having the plurality of light emitting diode chips mounted on one surface is placed, a work table on which a second substrate to which the plurality of light emitting diode chips are to be transferred is placed, and a push pin module for transferring the plurality of light emitting diode chips to the second substrate by pushing the other surface of the first substrate in a state that one surface of the first substrate and the second substrate are disposed to face each other, wherein the push pin module includes a plurality of push pin units each including a push pin for pushing the other surface of the first substrate, and the push pin module transfers the plurality of light emitting diode chips corresponding to each push pin of the plurality of push pin units to the second substrate at a time.

11 Claims, 10 Drawing Sheets

(58) Field of Classification Search
CPC ........... H01L 2224/75303; H01L 24/75; H01L 33/0095; H01L 21/67132
See application file for complete search history.

(56) References Cited

FOREIGN PATENT DOCUMENTS

| | | | |
|---|---|---|---|
| JP | 2005107930 | A | 4/2005 |
| KR | 100206911 | B1 | 7/1999 |
| KR | 100824083 | B1 | 4/2008 |
| KR | 101043846 | B1 | 6/2011 |
| KR | 1020130076441 | A | 7/2013 |
| KR | 1020150027718 | A | 3/2015 |
| KR | 1020160008187 | A | 12/2017 |
| KR | 1020170138593 | A | 12/2017 |

\* cited by examiner

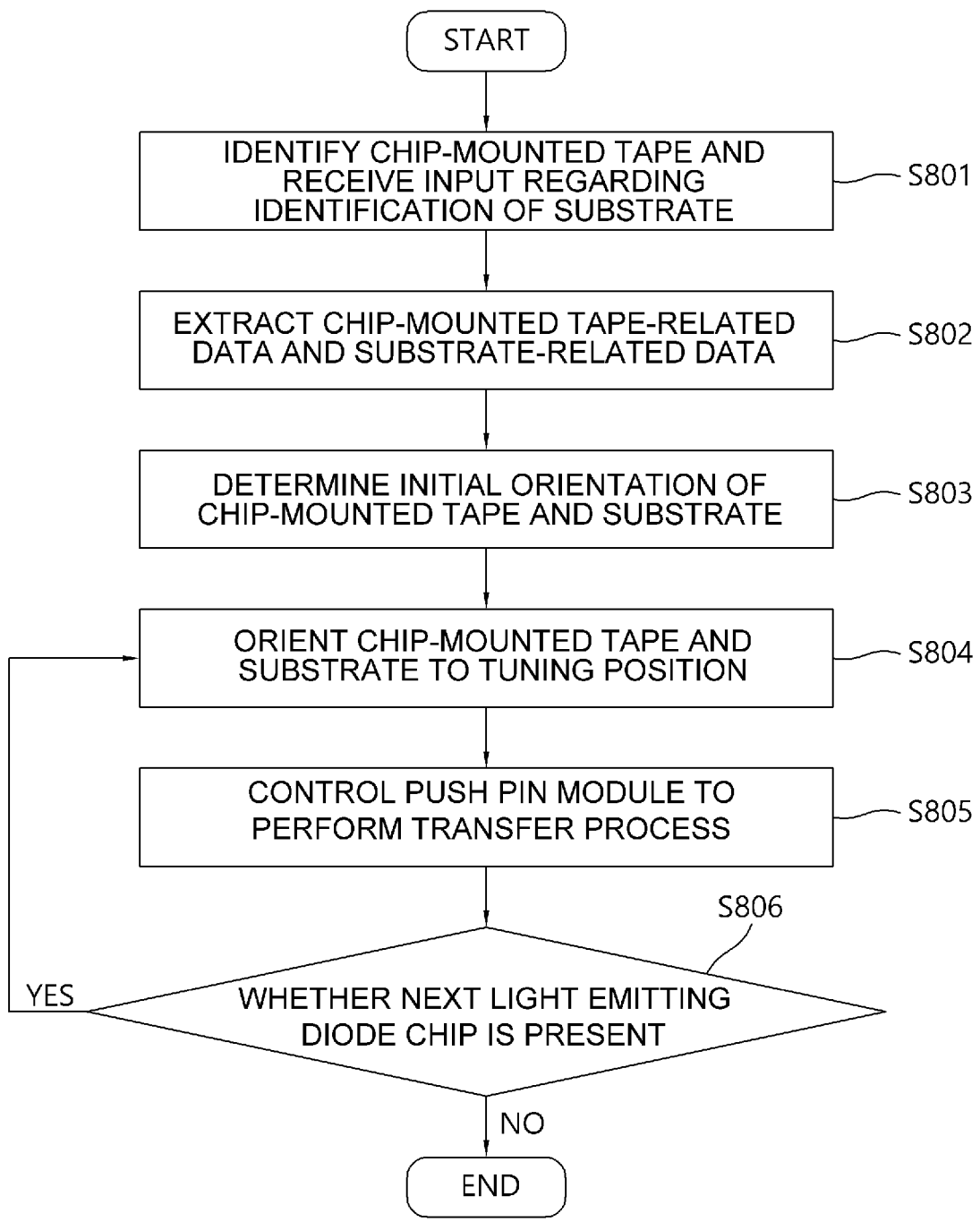

TRANSFER APPARATUS AND TRANSFER METHOD FOR TRANSFERRING LIGHT EMITTING DIODE CHIP

CROSS-REFERENCE TO RELATED APPLICATIONS

This application claims priority under 35 U.S.C. § 119 to Korean Patent Application No. 10-2018-0028820, filed on Mar. 12, 2018, Korean Patent Application No. 10-2018-0028856, filed on Mar. 12, 2018, and Korean Patent Application No. 10-2018-0028864, filed on Mar. 12, 2018, in the Korean Intellectual Property Office, the disclosures of which are incorporated herein by reference in its entirety.

TECHNICAL FIELD

The present invention relates to a transfer apparatus and a transfer method for transferring a light emitting diode chip.

BACKGROUND

In general, a light emitting diode chip is processed with formation of a circuit of each chip on a wafer, followed by separation into a plurality of individual chips. These light emitting diode chips are subjected to several transfer processes in package and module processes.

In this transfer process, depending on the purpose, the chip is transferred to a transfer tape or a substrate for the purpose of classifying the chip into a good product or a defective product, adjusting a chip interval, or controlling a chip direction or is transferred to a circuit board for the purpose of mounting the chip.

In the conventional transfer apparatus (i.e., pick-up and place apparatus), each light emitting diode chip is picked up and placed on a substrate to transfer each light emitting diode chip to the substrate. Regarding this, Korean Patent Laid-Open Publication No. 2016-0008187 discloses a chip transferring apparatus and a chip transferring method.

Meanwhile, an ultra small-sized light emitting diode chip (for example, a micro-LED) having a chip size of about 5 to 300 μm has recently received attention as a next-generation display device. This ultra small-sized light emitting diode chip may be applied to a light application field requiring low power, a small size, and a light weight, and thus research and development thereof have been actively conducted.

SUMMARY

In the conventional pick-up and place transfer apparatus and method, a collet having a hole with a vacuum for adsorbing the light emitting diode (LED) chip in a pick-up stage and air blown for breaking the vacuum at the center so as to place the adsorbed light emitting diode chip in a place stage. However, when the collet hole has a diameter of several micrometers (μm), it is not possible to secure vacuum pressure enough to pick up the LED chip and air pressure to break the vacuum due to channel resistance of the collet hole.

There is a problem in that it is difficult to transfer the light emitting diode chip using the conventional pick-up and place method as a size of the light emitting diode chip is reduced to several micrometers.

The present invention has been made to solve the above-described problems, and provides a transfer apparatus and a transfer method for transferring a light emitting diode chip to a transfer tape by pushing the other surface of a first substrate (including a substrate such as a mounting tape, a wafer, or the like) having the light emitting diode chip mounted thereon in a state that one surface of the first substrate and a second substrate (including a transfer tape, a substrate, or a circuit board) to which the light emitting diode chip is to be transferred are disposed to face each other. Meanwhile, the technical problem to be achieved by the present embodiment is not limited to the above-described technical problems, and other technical problems may be present.

To solve above-mentioned technical problem, an embodiment of the present invention provides a transfer apparatus for transferring a light emitting diode chip, comprising a stage on which a first substrate having the light emitting diode chip mounted on one surface is placed, a work table on which a second substrate to which the light emitting diode chip is to be transferred is placed, and a push pin module for transferring the light emitting diode chip to the second substrate by pushing a portion corresponding to the light emitting diode chip from the other surface of the first substrate in a state that one surface of the first substrate and the second substrate are disposed to face each other, wherein the push pin module includes a pressure control unit for maintaining a pressure between the light emitting diode chip and the second substrate to be a predetermined pressure.

Another embodiment of the present invention provides a transfer apparatus for transferring a plurality of light emitting diode chips, comprising a stage on which a first substrate having the plurality of light emitting diode chips mounted on one surface is placed, a work table on which a second substrate to which the plurality of light emitting diode chips are to be transferred is placed, and a push pin module for transferring the plurality of light emitting diode chips to the second substrate by pushing the other surface of the first substrate in a state that one surface of the first substrate and the second substrate are disposed to face each other, wherein the push pin module includes a plurality of push pin units each including a push pin for pushing the other surface of the first substrate, and the push pin module transfers the plurality of light emitting diode chips corresponding to each push pin of the plurality of push pin units to the second substrate at a time.

Another embodiment of the present invention provides a transfer apparatus for transferring a plurality of light emitting diode chips, comprising a stage on which a first substrate having the light emitting diode chip mounted on one surface is placed, a work table on which a second substrate to which the light emitting diode chip is to be transferred is placed, and a push pin module for transferring the light emitting diode chip to the second substrate by pushing the other surface of the first substrate in a state that one surface of the first substrate and the second substrate are disposed to face each other, wherein the stage includes a main actuator for controlling movement of the stage to a standby position and a sub-actuator for controlling movement of the stage between pitches of light emitting diode chip.

Another embodiment of the present invention provides a method for transferring a light emitting diode chip, comprising preparing a first substrate having the light emitting diode chip mounted on one surface, preparing a second substrate to which the light emitting diode chip is to be transferred, and transferring the light emitting diode chip to the second substrate by pushing a portion corresponding to the light emitting diode chip from the other surface of the first substrate in a state that one surface of the first substrate and the second substrate are disposed to face each other, wherein the transferring of the light emitting diode chip to the second substrate includes maintaining a pressure between the light emitting diode chip and the second substrate to be a predetermined pressure.

Another embodiment of the present invention provides a method for transferring a plurality of light emitting diode chips, comprising preparing a first substrate having the plurality of light emitting diode chips mounted on one surface, preparing a second substrate to which the plurality of light emitting diode chips are to be transferred, and transferring the plurality of light emitting diode chips to the second substrate by pushing the other surface of the first substrate in a state that one surface of the first substrate and the second substrate are disposed to face each other, wherein the transferring of the plurality of light emitting diode chips to the second substrate includes transferring a plurality of light emitting diode chips corresponding to each of the plurality of push pins to the second substrate at a time.

Above-mentioned embodiments are just examples, and it should be understood that they should not be interpreted as limiting the present invention. There might be additional embodiments described in the specification, except for above-mentioned embodiments.

BRIEF DESCRIPTION OF THE DRAWINGS

FIG. 8 is a flowchart showing a method for transferring a light emitting diode chip according to an embodiment of the present invention.

DETAILED DESCRIPTION OF EMBODIMENTS

Figure 1:
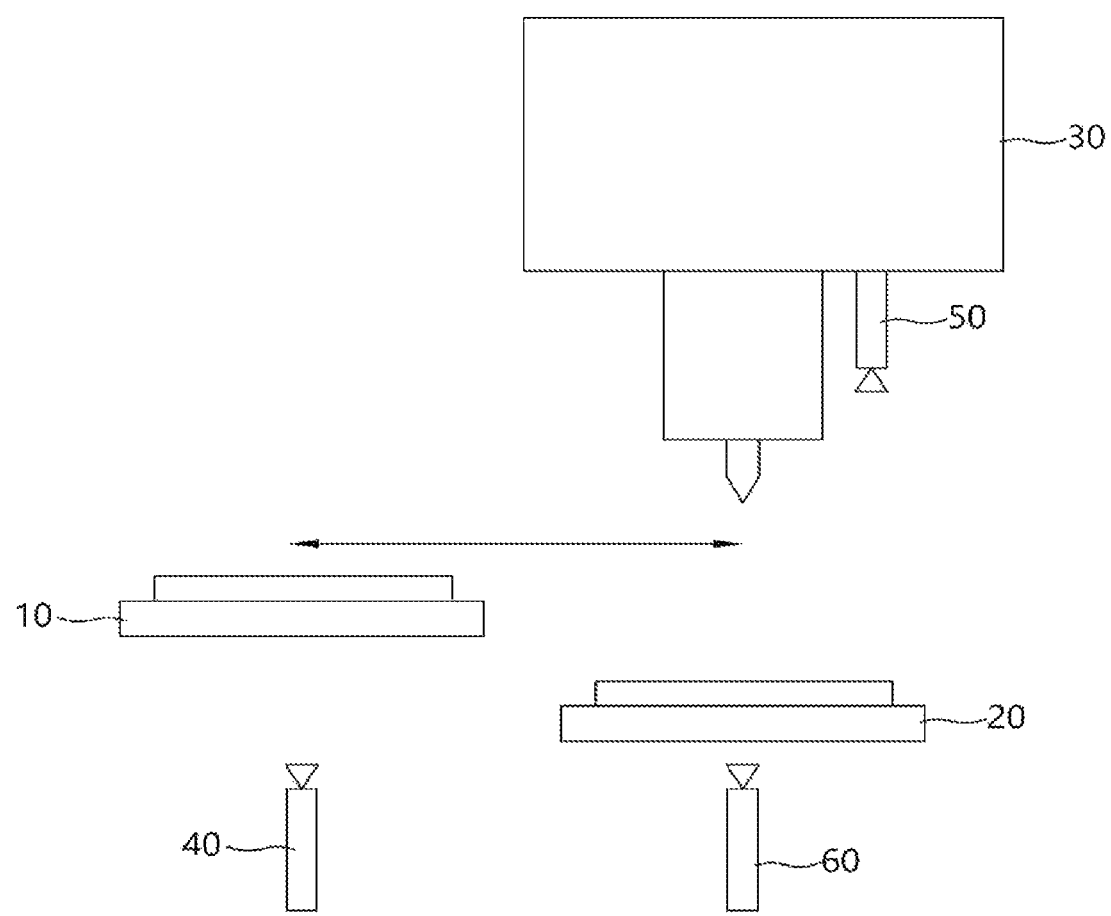
FIG. 1 is a schematic view of a transfer apparatus according to an embodiment of the present invention.

Hereinafter, embodiments of the present invention will be described in detail so as to be easily practiced by those skilled in the art in the technical field to which the present invention pertains. However, the present invention may be modified in various different ways and is not limited to these Examples provided in the present description. Further, in the accompanying drawings, portions unrelated to the description will be omitted in order to obviously describe the present invention, and similar reference numerals will be used to describe similar portions throughout the present specification.

Throughout the present specification, a case in which any one part is "connected" with the other part includes a case in which the parts are "directly connected" with each other and a case in which the parts are "electrically connected" with each other with an other element interposed therebetween. Further, unless explicitly described to the contrary, "including" any components implies the inclusion of other elements but not the exclusion of any other elements, and should be understood to not preclude the presence or addition possibilities of one or more other features, numerals, steps, operations, components, parts, or a combination thereof.

In the present specification, the "part" includes a unit implemented by hardware, a unit implemented by software, and a unit implemented by using both hardware and software. Further, one unit may be implemented using two or more hardware, or two or more units may be implemented by one hardware.

Hereinafter, embodiments of the present invention will be described in detail with reference to the accompanying drawings.

FIG. 1 is a schematic view of a transfer apparatus according to an exemplary embodiment of the present invention. The transfer apparatus will be described with reference to FIG. 1. The transfer apparatus includes a stage 10.

The stage is placed with a first substrate on which a plurality of light emitting diode chips are mounted on one surface. The "first substrate" is a substrate on which the light emitting diode chip is mounted, and may include a tape, a wafer, a substrate, and the like.

The stage 10 holds the first substrate by supporting a peripheral portion of the first substrate. In the present invention, the light emitting diode chip is an ultra small-sized semiconductor device having a size of 5 to 300 μm, and may mean a product before packaging and a product after packaging. In addition, the light emitting diode chip in the present invention may also mean a light emitting diode (LED). A central portion of the stage 10 is opened, and through the central portion, the light emitting diode chip mounted on the first substrate is transferred to a second substrate positioned below the stage 10. The stage 10 may move between a preparation position (position in FIG. 1) and a transfer process position (position on a work table) (see an arrow).

The stage 10 moves along an X axis and a Y axis so that a push pin module 30 is capable of transferring each light emitting diode chip to the second substrate at the same position during the transfer process.

The transfer apparatus further includes a first substrate scanning unit 40 positioned below the preparation position.

The first substrate scanning unit 40 scans positions of the plurality of light emitting diode chips mounted on the first substrate when the stage 10 is in standby mode at the preparation position. For example, the first substrate scanning unit 40 may scan an array interval between the plurality of light emitting diode chips mounted on the first substrate.

The transfer apparatus further includes a work table 20. The second substrate on which the plurality of light emitting diode chips mounted on the first substrate are to be transferred is placed on the work table 20. Here, the "second substrate" is a substrate to which the light emitting diode chip is to be transferred, and includes a tape, a substrate, a circuit board, and the like.

The work table 20 is positioned below the stage 10 at the transfer process position.

Figure 2A:
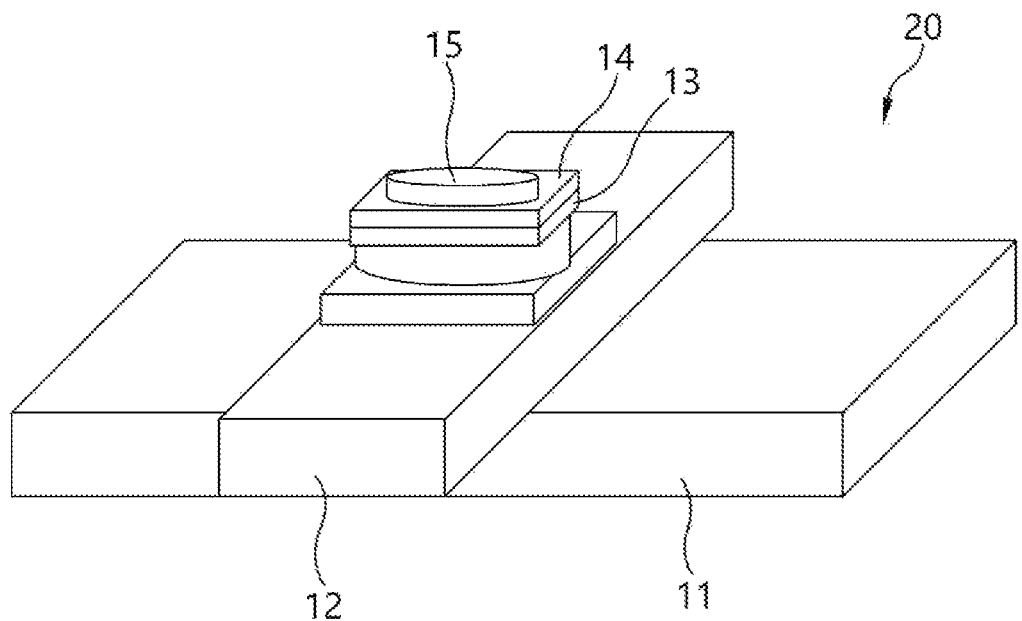
FIG. 2A is a schematic view of a stage according to an embodiment of the present invention.

FIG. 2A is a schematic view of the work table according to an embodiment of the present invention. Referring to FIG. 2A, the work table 20 includes main actuators 11 and 12 and sub-actuators 13 and 14.

The sub-actuators 13 and 14 are disposed on the main actuators 11 and 12, and the main actuators 11 and 12 include an X axis motor 11 and a Y axis motor 12. The sub-actuators 13 and 14 also include an X-axis motor 13 and a Y-axis motor 14.

Here, the main actuators 11 and 12 may include a first motor, for example, a linear motor, a servo motor, a step motor, or the like. The first motor is a motor used in various technical fields, and is manufactured so as to be usable in a relatively wide working area. Meanwhile, the first motor may cover the relatively wide working area, but a response time is slow and it is difficult to control an operation accurately.

Meanwhile, the sub-actuators 13 and 14 may include the second motor, for example, a voice coil motor (VCM), a piezo motor, an ultrasonic motor, or the like. The second motor has a high response speed and enables accurate operation control, but a relatively short maximum moving distance, which narrows the working area.

When only the first motor is used as the actuator of the work table 20, there are problems in that the response speed is lowered and it is difficult to control micro operation, resulting in lower productivity and accuracy of the work.

Further, when only the second motor is used as the actuator of the work table 20, high speed or fine operation control is possible but the working area is limited.

In order to solve the above-described problems, the present invention includes and selectively uses the main actuators 11 and 12 and the sub-actuators 13 and 14 as actuators of the work table 20. That is, when the work table 20 is required to move a long section between the work areas during the transfer process, the main actuators 11 and 12 are used to control the work table 20. When the work table 20 is required to be controlled at high speed or with precision, the sub-actuators 13 and 14 are used.

By selectively using the main actuators 11 and 12 and the sub-actuators 13 and 14 as described above, accuracy of the operation may be enhanced while simultaneously improving productivity.

Meanwhile, the stage 10, similar to the work table 20, may include a main actuator and a sub-actuator. That is, the sub-actuator is disposed on the main actuator of the stage 10, and the main actuator and the sub-actuator of the stage 10 may be constituted in the same manner as the main actuators 11 and 12 and the sub-actuators 13 and 14 of the work table 20, respectively.

Figure 2B:
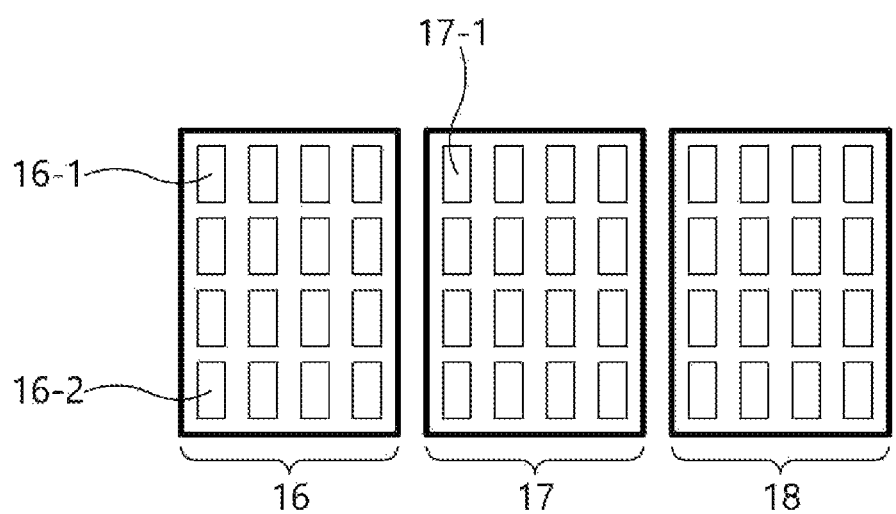
FIG. 2B is a schematic view of a first substrate according to an embodiment of the present invention.

FIG. 2B is a view showing the first substrate. Referring to FIG. 2B, the first substrate has a plurality of regions. For example, the first substrate may include a first region 16, a second region 17, and a third region 18. The plurality of regions of the first substrate may be determined based on positions of the plurality of light emitting diode chips scanned by the first substrate scanning unit 40.

The stage 10 is controlled by the main actuator of the stage 10 when the stage 10 moves, for example, to a standby position of the first region 16 (a position for starting the operation in the first region). Meanwhile, when the stage 10 performs the movement between pitches of the light emitting diode chip, the stage 10 is controlled by the sub-actuator of the stage 10. Here, the movement between pitches of the light emitting diode chip means that the stage 10 moves by the pitch of the light emitting diode chip. Specifically, when the push pin module 30 is positioned on the first light emitting diode chip and the stage 10 performs the movement between the pitches of the light emitting diode chip, the push pin module 30 is positioned on the second light emitting diode chip adjacent to the first light emitting diode chip.

Upon considering a process of controlling the stage 10 using the main actuator and the sub-actuator of the stage 10, the stage 10 is moved by the main actuator of the stage 10 so that the push pin module 30 is positioned on a starting point 16-1 of the first region 16. Here, the sub-actuator of the stage 10 is not operated.

Then, the stage 10 performs the movement between the pitches of the light emitting diode chip. That is, the transfer process for the plurality of light emitting diode chips included in the first region 16 is sequentially performed by the sub-actuator of the stage 10. When the transfer process for the first region 16 is performed, the main actuator of the stage 10 is not operated. By performing the transfer process by the sub-actuator of the stage 10, productivity and precision in the transfer process may be increased.

After the light emitting diode chip corresponding to an ending point 16-2 of the first region 16 is transferred, the stage 10 is moved by the main actuator of the stage 10 so that the push pin module 30 is positioned to the starting point 17-1 of the second region 17. Subsequently, the transfer process for the plurality of light emitting diode chips included in the second region 17 is sequentially performed by the sub-actuator of the stage 10.

By selectively using the main actuator and the sub-actuator of the stage 10 as described above, accuracy of the operation may be enhanced while simultaneously improving productivity.

Referring again to FIG. 1, the transfer apparatus may further include a second substrate scanning unit 50. The second substrate scanning unit 50 is positioned on the work table 20 and scans a position of the circuit trace disposed on the second substrate.

The transfer apparatus further includes a push pin module 30. The push pin module 30 selectively transfers one or a plurality of light emitting diode chips to the second substrate at the transfer process position.

In the present invention, the transfer may refer to transport of the light emitting diode chip and bonding of the light emitting diode chip.

The push pin module 30 pushes the other surface of the first substrate using the push pin in a state that one surface of the first substrate and the second substrate are disposed to face each other, thereby transferring the plurality of light emitting diode chips to the second substrate.

The transfer apparatus further includes a push pin scanning unit 60. The push pin scanning unit 60 periodically scans whether the push pin is positioned at a correct position (the center of a push pin housing to be described below). For example, the push pin scanning unit 60 may scan whether the push pin is positioned at the correct position after the push pin is replaced.

The transfer apparatus may further include a control unit (not shown) having a memory. The control unit controls each constitution of the transfer apparatus so that the transfer apparatus is operated. Hereinafter, it is described that each constitution of the transfer apparatus directly performs an operation, but this description also includes the control unit controlling each constitution so that each constitution performs the corresponding operation.

Figure 3:
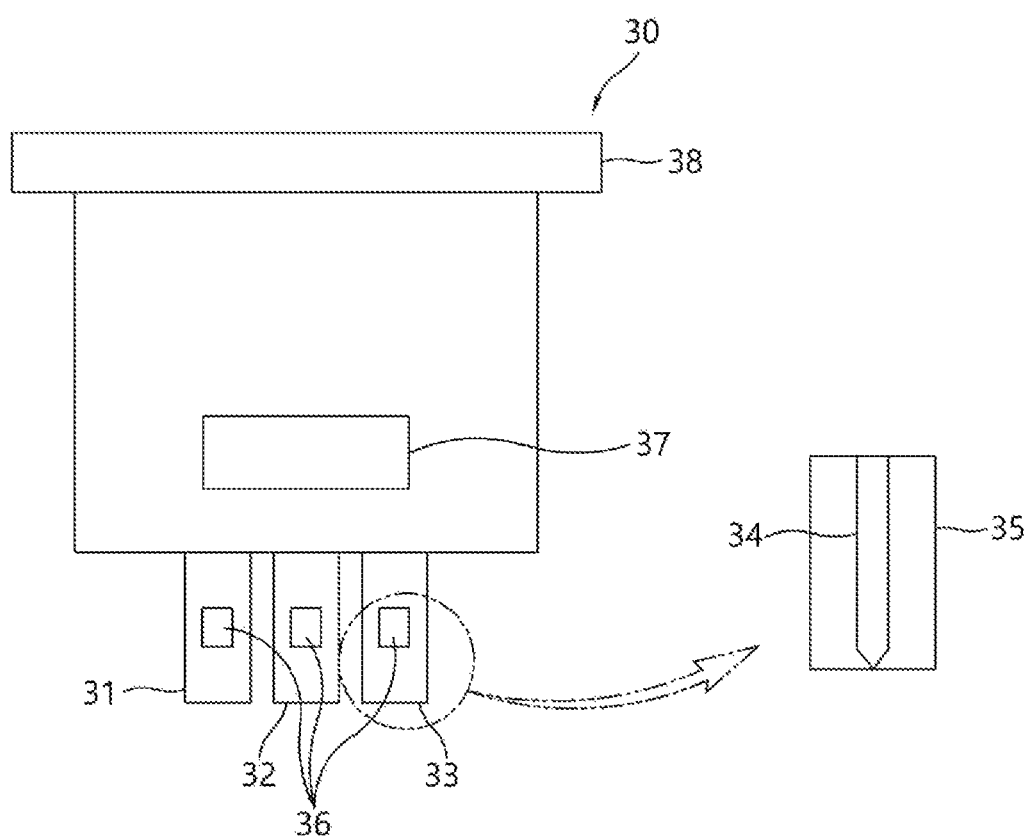
FIG. 3 is a schematic view of a push pin module according to an embodiment of the present invention.

FIG. 3 is a schematic view of a push pin module according to an embodiment of the present invention.

Referring to FIG. 3, the push pin module 30 includes a plurality of push pin units 31, 32, and 33.

Each of the plurality of push pin units 31, 32, and 33 includes a push pin 34 and a push pin housing 35. Here, the push pin housing 35 protects the push pin 34 and is brought into contact with the first substrate.

The push pin 34 is moved vertically to push the other surface of the first substrate, and thus the light emitting diode chip corresponding to the corresponding portion is transferred to the second substrate.

Each of the plurality of push pin units 31, 32, and 33 further includes a vacuum unit 36 capable of separating the first substrate from the light emitting diode chip after the light emitting diode chip is transferred to the second substrate by the push pin 34.

Figure 4:
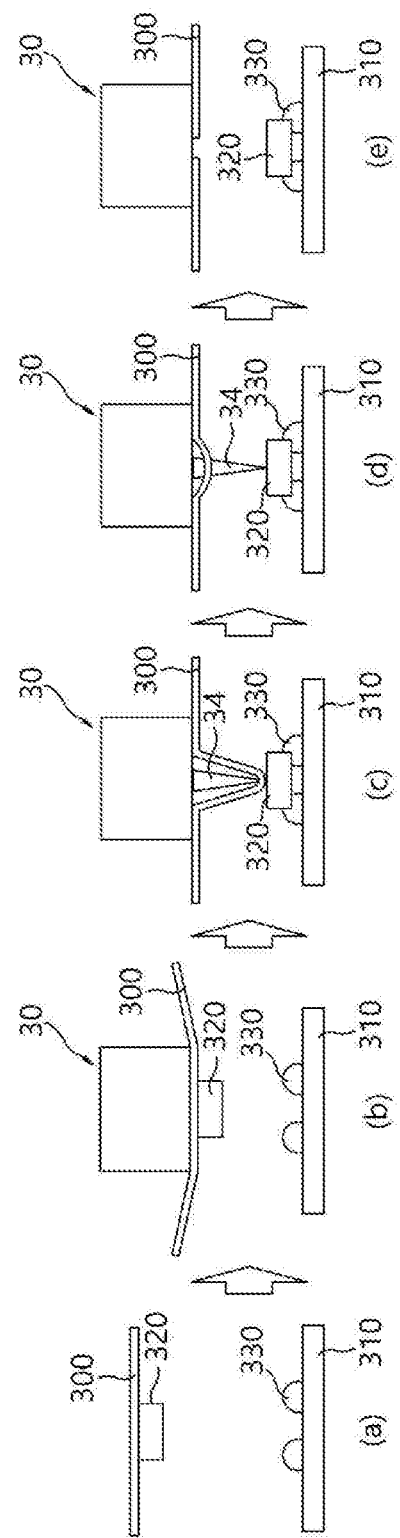
FIGS. 4, 5A, and 5B are views explaining a transfer method according to an embodiment of the present invention.
Figure 5A:
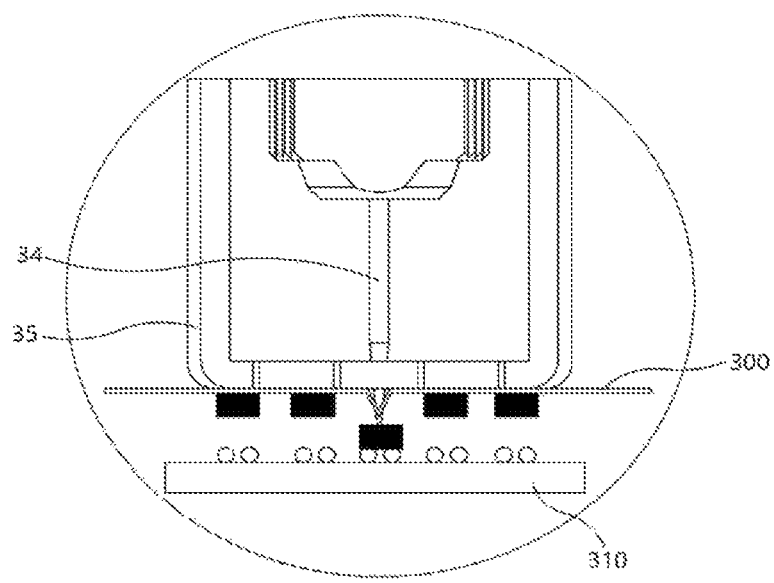

Next, with reference to FIGS. 4 and 5A, a method for transferring a light emitting diode chip according to an embodiment of the present invention will be described. Referring to FIG. 4, a first substrate 300 on which a target light emitting diode chip 320 is mounted on one surface and a second substrate 310 having circuit traces 330 are prepared (see (a) in FIG. 4). Here, the first substrate 300 may be, for example, a tape, and the second substrate 310 may be, for example, a substrate or a circuit board.

Then, the push pin module 30 is brought into contact with the corresponding position of the target light emitting diode chip 320 on the other surface of the first substrate 300 based on the scan information of the first substrate 300 (see (b) in FIG. 4).

Next, the push pin 34 protrudes toward the other surface of the first substrate 300, and thus the target light emitting diode chip 320 is transferred to the second substrate 310 (see (c) in FIG. 4). Here, a part of the first substrate 300 may be perforated by the push pin 34 (see (d) in FIG. 4).

Here, a pressure between the target light emitting diode chip 320 and the second substrate 310 is maintained to be a predetermined pressure through a pressure control unit 37 to be described below.

Then, the push pin 34 returns back into the push pin housing 35 (see (e) in FIG. 4). Here, due to protrusion of the push pin 34, a part of the first substrate 300 may be stretched, or a part of the first substrate 300 may still be attached to the target light emitting diode chip 320. Here, the first substrate 300 may be returned to the original position by pressing the first substrate 300 using the vacuum unit 36.

Next, the first substrate stage 10 and the work table 20 are moved so that the push pin module 30 is positioned on the other target light emitting diode chip, and then the other target light emitting diode chip is transferred to the second substrate 310.

All of the light emitting diode chips mounted on the first substrate 300 are transferred to the second substrate 310 while repeating the above-described process.

Figure 5B:
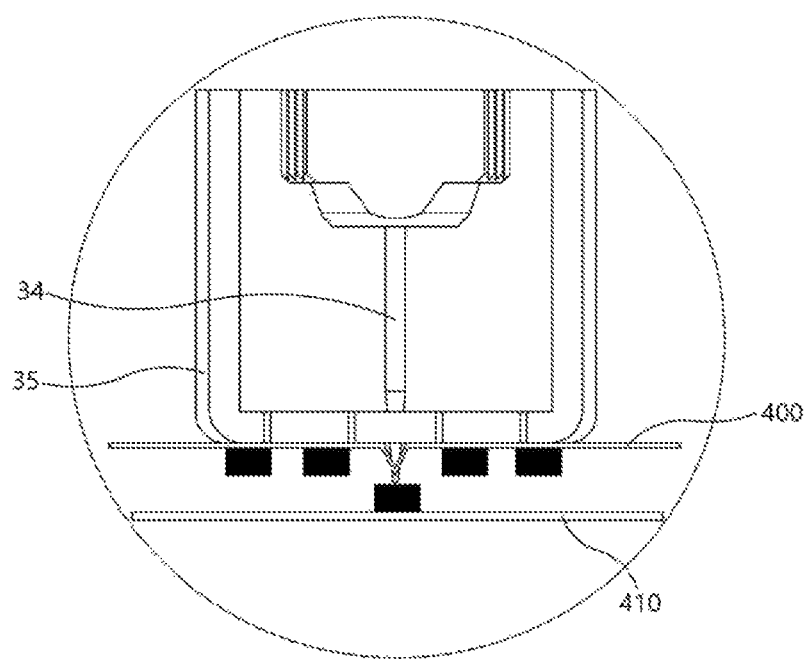

FIG. 5B shows a transfer process according to another embodiment of the present invention. According to another embodiment of the present invention, the first substrate 400 may be, for example, a tape having a plurality of light emitting diode chips mounted on one surface thereof. Further, the second substrate 410 may be a transfer tape to which the light emitting diode chips are to be transferred.

Referring again to FIG. 3, in the present invention, the plurality of light emitting diode chips may be transferred to the second substrate at a time by performing a transfer process using the plurality of push pin units 31, 32, and 33. By using the plurality of push pin units 31, 32, and 33, the light emitting diode chip may be quickly transferred to the second substrate.

Referring to FIG. 6, a method for transferring a light emitting diode chip using a plurality of push pin units according to an embodiment of the present invention will be described.

Figure 6A:
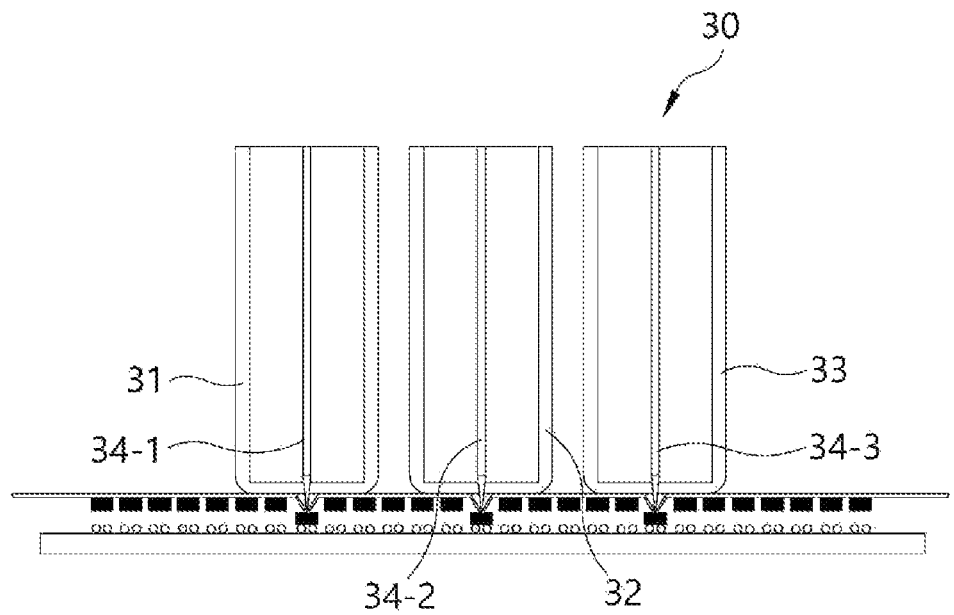
FIGS. 6A, 6B, and 6C are views explaining a transfer method according to another embodiment of the present invention.

Referring to FIG. 6A, a plurality of light emitting diode chips are attached to one surface of the first substrate, and one surface of the first substrate and a second substrate are disposed to face each other. Here, the push pin module 30 is brought into contact with the other surface of the first substrate.

Then, the plurality of push pin units 31, 32, and 33 push the respective push pins 34-1, 34-2, and 34-3 toward the other surface of the first substrate, and thus the plurality of corresponding light emitting diode chips (three light emitting diode chips in FIG. 6) are transferred to the second substrate at a time.

Figure 6B:
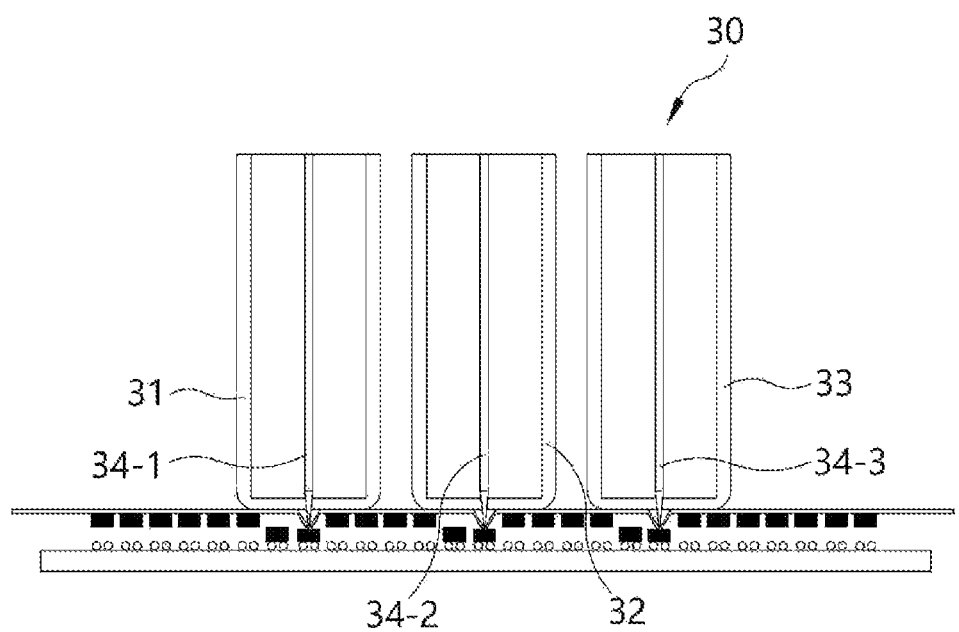

Next, referring to FIG. 6B, when the stage 10 and the work table 20 are moved by a predetermined range, and the respective push pins 34-1, 34-2, and 34-3 are disposed at positions corresponding to the plurality of light emitting diode chips to be next-transferred from an upper part of the first substrate.

In this state, the plurality of push pin units 31, 32, and 33 push the respective push pins 34-1, 34-2, and 34-3 toward the other surface of the first substrate, and thus the plurality of corresponding light emitting diode chips are transferred to the second substrate at a time.

Most of the light emitting diode chips mounted on the first substrate are transferred to the second substrate while repeating the above-described process. However, the light emitting diode chip mounted on an outer peripheral portion of the first substrate or the light emitting diode chip positioned in a region where arrangement intervals (or arrangement positions) between the light emitting diode chips are not uniform is not capable of being transferred to the second substrate using the plurality of push pin units 31, 32, and 33. The light emitting diode chip that is not capable of being transferred using the plurality of push pin units 31, 32, and 33 may not be detected through a scanning process through the first substrate scanning unit 40.

Figure 6C:
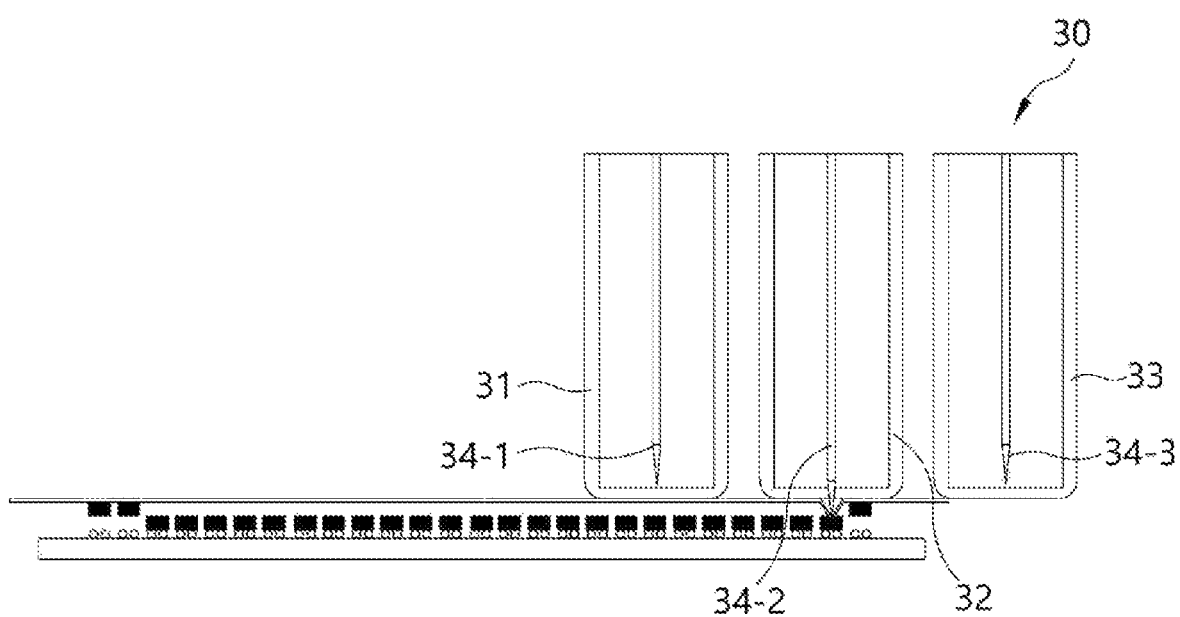

Thus, as shown in FIG. 6C, the light emitting diode chips, which are not subjected to the transfer process by the plurality of push pin units 31, 32, and 33, are transferred to the second substrate sequentially using one (push pin unit 32 in FIG. 6C) of the plurality of push pin units 31, 32, and 33.

Referring again to FIG. 3, the push pin module 30 further includes the pressure control unit 37. The light emitting diode chip and the second substrate are brought into contact with each other when the push pin 34 pushes the other surface of the first substrate. Here, the pressure control unit 37 maintains a pressure between the light emitting diode chip and the second substrate to be a predetermined pressure.

Preferably, the pressure control unit 37 maintains the pressure between each light emitting diode chip and the second substrate to be the same pressure.

The pressure control unit 37 may include, for example, a spring or a voice coil motor.

Figure 7A:
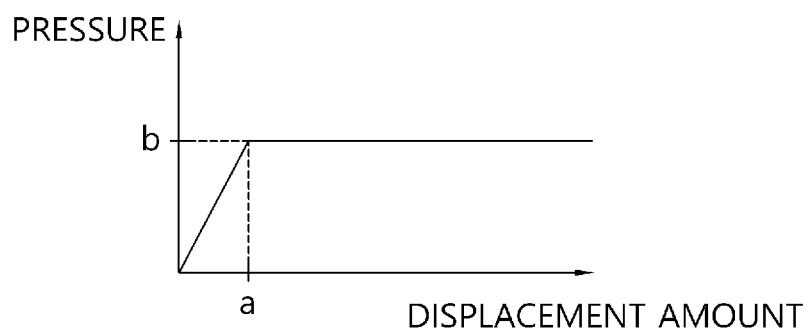
FIGS. 7A and 7B are views explaining characteristics of a pressure control unit according to an embodiment of the present invention.

Here, as shown in FIG. 7A, the spring has characteristics that the pressure is increased linearly up to a specific displacement amount (a) and a constant pressure (b) is maintained after the corresponding displacement amount (a) even if the displacement amount (a) is increased, and the pressure between the push pin 34 and the second substrate may be maintained to be a constant pressure (b) by maintaining the specific displacement amount or above.

In addition, the voice coil motor is a linear motor including a permanent magnet and a coil, and performs linear motion through a current flowing in the voice coil.

Figure 7B:
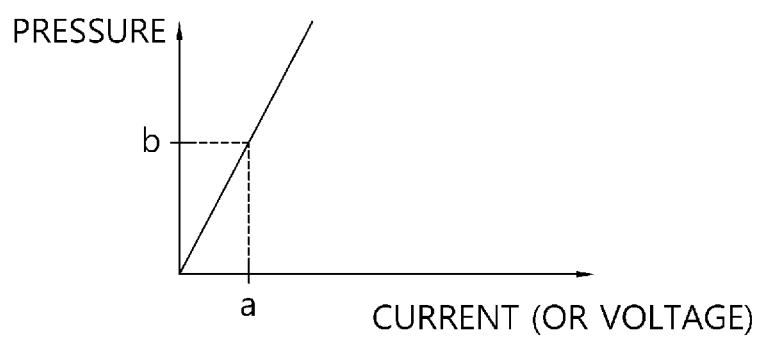

This voice coil motor has a characteristic that the pressure is proportional to a current (or voltage) applied to the voice coil motor as shown in FIG. 7B.

Therefore, by applying a specific current (or voltage) (a) to the voice coil motor, the pressure between the push pin 34 and the second substrate may be maintained to be a constant pressure (b).

When the push pin 34 pushes the other surface of the first substrate to transfer the light emitting diode chip to the second substrate, the height of the light emitting diode chips transferred to the second substrate may be different from each other when the same pressure is not applied. In addition, when a large pressure is applied, the light emitting diode chip may be damaged.

In the present invention, by maintaining the pressure between each light emitting diode chip and the second substrate to be the same as each other by using the pressure control unit 37, it is possible to prevent each light emitting diode chip from being damaged in the transfer process.

Further, each light emitting diode chip may be transferred to the second substrate at a uniform height by the pressure control unit 37.

The push pin module 30 further includes a width varying unit 38. The width varying unit 38 adjusts a width between the plurality of push pin units 31, 32, and 33 based on the arrangement interval between the light emitting diode chips scanned by the first substrate scanning unit 40.

The arrangement intervals between the plurality of light emitting diode chips mounted on the first substrate may be different from each other. When the transfer process is performed using the plurality of push pin units 31, 32, and 33 without considering the arrangement interval between the light emitting diode chips, the light emitting diode chip may not be properly transferred to the second substrate.

For example, when the arrangement interval between the light emitting diode chips in a specific region is wider or narrower than the width (preferably, the width of each push pin 34) of the plurality of push pin units 31, 32, and 33, the push pin 34 presses a non-center portion of the light emitting diode chip (or a portion where the light emitting diode chip is not positioned in some cases), and thus the corresponding light emitting diode chip may not be properly transferred to the second substrate.

In the present invention, the above-described problem may be solved by adjusting the width between the plurality of push pin units 31, 32, and 33 in real time by the width varying unit 38 based on the arrangement interval between the light emitting diode chips during the transfer process.

Hereinafter, a transfer method performed by the transfer apparatus will be described. FIG. 8 is a flowchart showing a method for transferring the light emitting diode chip according to an embodiment of the present invention to the second substrate.

Referring to FIG. 8, in order to determine which light emitting diode chips are to be transferred to the second substrate and where the light emitting diode chips are to be positioned on the second substrate, a control unit may receive an input regarding identification of the first substrate including the light emitting diode chips and identification of the second substrate (S801).

The control unit may extract first substrate-related data and second substrate-related data from the memory based on the input regarding the identification of the first substrate and the identification of the second substrate (S802).

The second substrate-related data includes patterns of the circuit traces (including positions) on the second substrate, the number of light emitting diode chips to be transferred to the circuit traces and relative positions of the light emitting diode chips, and quality requirements of the light emitting diode chip.

In addition, the first substrate-related data includes a relative position of the light emitting diode chip and a map thereof.

Then, the control unit may determine an initial orientation of the first substrate and the second substrate for transferring the light emitting diode chip (S803).

Once the initial orientation of the first substrate and the second substrate is determined, the control unit controls the stage 10 and the work table 20 so that the first substrate and the second substrate are oriented to tuning positions in the transfer process (S804).

In step S804, the control unit determines the position of the circuit trace to which the light emitting diode chip is to be transferred and the light emitting diode chip to be transferred in the first substrate.

Subsequently, the control unit controls the push pin module 30 so that the light emitting diode chip is transferred to the second substrate (S805).

After the corresponding light emitting diode chip is transferred to the second substrate, the control unit determines whether a light emitting diode chip to be next-transferred is present (S806).

When the light emitting diode chip to be transferred remains, the control unit returns to step S804 to perform the transfer process. When there is no LED chip to be transferred, the transfer process is terminated.

Figure 9:
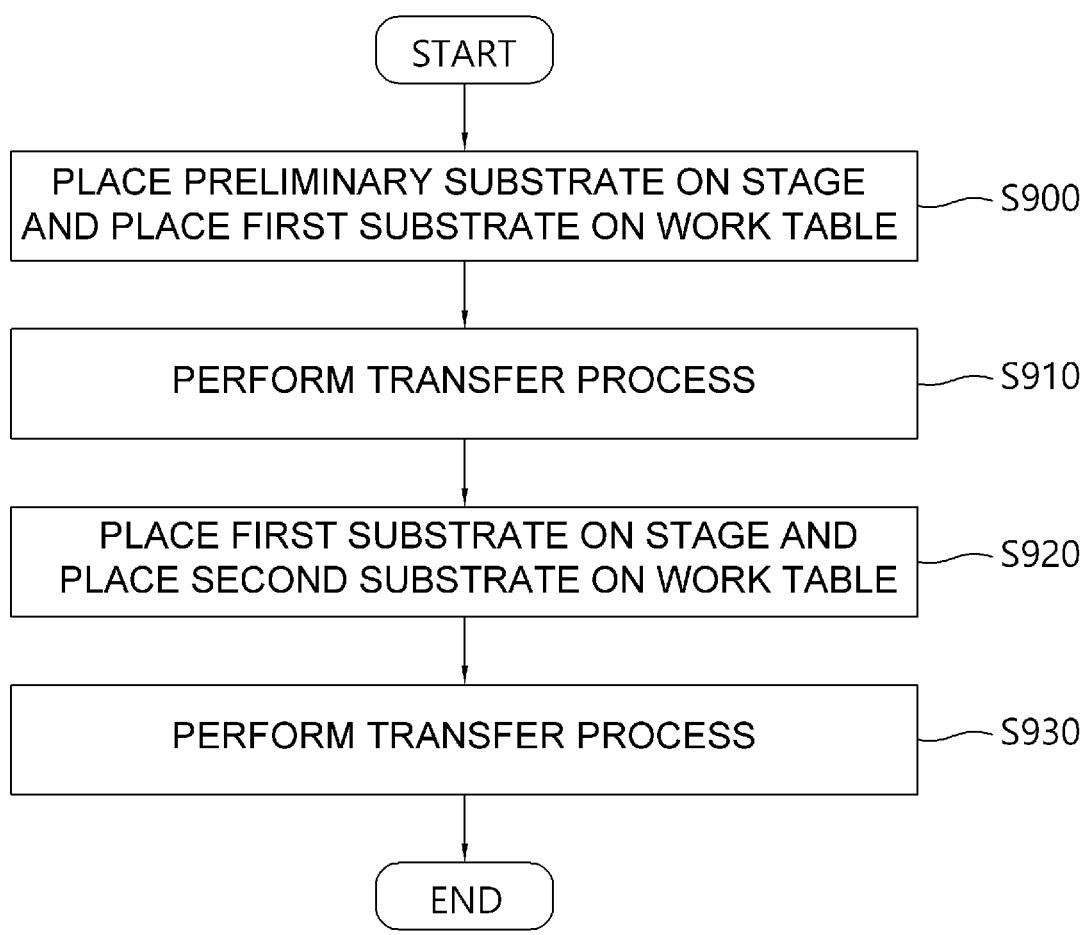
FIG. 9 is a flowchart showing a method for transferring a light emitting diode chip according to another embodiment of the present invention.

FIG. 9 is a flowchart showing a method for transferring a light emitting diode chip according to an embodiment of the present invention to the second substrate.

Referring to FIG. 9, a preliminary substrate having a plurality of light emitting diode chips mounted on one surface is placed on the stage 10 in standby mode at the preparation position (S900).

Here, arrangement intervals between the plurality of light emitting diode chips mounted on the preliminary substrate are not uniform. When the transfer process is performed using the preliminary substrate, the arrangement intervals between the plurality of light emitting diode chips are not uniform, and thus it is necessary to transfer each of the light emitting diode chips by one push pin unit (for example, 32) based on the scan information after scanning the preliminary substrate.

In other words, in the transfer process of the plurality of light emitting diode chips mounted on the preliminary substrate, the plurality of push pin units 31, 32, and 33 are not capable of being used.

In the present invention, a rearrangement process is performed in order to perform the transfer process using one or the plurality of push pin units 31, 32, and 33.

Meanwhile, in step S900, the first substrate to which the plurality of light emitting diode chips are to be transferred is placed on the work table 20.

Then, the first substrate scanning unit 40 scans a plurality of light emitting diode chips mounted on the preliminary substrate. Here, the first substrate scanning unit 40 scans positions of the plurality of light emitting diode chips mounted on the preliminary substrate.

Then, the stage 10 is moved to the transfer process position, and the transfer process is performed (S910).

In this rearrangement process, the plurality of light emitting diode chips are transferred to the first substrate so as to be tuned with the arrangement interval between the circuit traces disposed on the second substrate on which the light emitting diode chips are finally to be transferred.

That is, through the rearrangement process, the arrangement interval between the plurality of light emitting diode chips mounted on one surface of the first substrate and the arrangement interval between circuit traces disposed on the second substrate are previously tuned.

As described above, the arrangement intervals between the plurality of light emitting diode chips mounted on the preliminary substrate are not uniform, and thus each of the light emitting diode chips is transferred to the first substrate using one (for example, 32) of the plurality of push pin units 31, 32, and 33 based on the scan information of the first substrate scanning unit 40.

After the rearrangement process is completed, the first substrate having the plurality of light emitting diode chips mounted on one surface is placed on the stage 10 in standby mode at the preparation position. In addition, the second substrate to which the plurality of light emitting diode chips are to be transferred is placed on the work table 20 (S920).

Then, the first substrate scanning unit 40 scans positions of the plurality of light emitting diode chips mounted on the first substrate. Here, the first substrate scanning unit 40 scans arrangement intervals of the plurality of light emitting diode chips mounted on the first substrate. Here, the scan information scanned by the first substrate scanning unit 40 is stored in the memory. The scan information includes each arrangement interval between the light emitting diode chips.

This scan information is used for varying the width between the plurality of push pin units 31, 32, and 33 by the width varying unit 38. In addition, the scan information is used to detect light emitting diode chips that are not capable of being transferred by the plurality of push pin units 31, 32, and 33 (for example, when the light emitting diode chips are positioned at the outer peripheral portion of the first substrate or when the alignment interval is out of a predetermined range, i.e., when it is difficult to correct the chip through the width varying unit 38).

Further, the second substrate scanning unit 50 scans the position of the circuit trace disposed on the second substrate.

Thereafter, the stage 10 is moved to a transfer process position, and the transfer process is performed S930.

Here, the arrangement intervals of the plurality of light emitting diode chips mounted on the first substrate are relatively uniform through the above-described rearrangement process, and thus the plurality of light emitting diode chips may be transferred to the second substrate at a time through the plurality of push pin units 31, 32, and 33.

During the transfer process, the width varying unit 38 varies the width between the plurality of push pin units 31, 32, and 33 based on the scan information, and thus the plurality of light emitting diode chips may be well transferred to the second substrate.

Further, the push pin module 30 classifies the chips into first light emitting diode chips to be transferred using the plurality of push pin units 31, 32, and 33 and second light emitting diode chips to be transferred using one push pin unit 32 of the plurality of push pin units 31, 32, and 33, based on the scan information.

The push pin module 30 transfers the first light emitting diode chips to the second substrate at a time based on classification results, using the plurality of push pin units 31, 32, and 33. Then, the push pin module 30 sequentially transfers the second light emitting diode chips to the second substrate, using one push pin unit 32 of the plurality of push pin units 31, 32, and 33.

It should be interpreted that the scope of the present invention is defined by the following claims rather than the above-mentioned detailed description and all modifications or alterations deduced from the meaning, the scope, and equivalences of the claims are included in the scope of the present invention.

According to any one embodiment of the present invention, it is possible to transfer an ultra small-sized light emitting diode chip with high positional accuracy.

In addition, productivity may be improved by transferring the light emitting diode chips at a time using the plurality of push pin units.

LIST OF REFERENCES

10: Stage
20: Work table
30: Push pin module
31: Push pin unit
32: Push pin unit
33: Push pin unit
34: Push pin unit
35: Push pin housing
36: Vacuum unit
37: Pressure control unit
38: Width varying unit
40: First substrate scanning unit
50: Second substrate scanning unit
60: Push pin scanning unit

What is claimed is:

1. A transfer apparatus for transferring a plurality of light emitting diode chips, comprising:
a first substrate having the plurality of light emitting diode chips mounted on one surface is placed;
a work table on which a second substrate to which the plurality of light emitting diode chips are to be transferred is placed;
a push pin module for transferring the plurality of light emitting diode chips to the second substrate by pushing the other surface of the first substrate in a state that one surface of the first substrate and the second substrate are disposed to face each other; and
a first substrate scanning unit for scanning positions of the plurality of light emitting diode chips mounted on the first substrate,
wherein the push pin module includes a plurality of push pin units each including a push pin for pushing the other surface of the first substrate, and
the push pin module transfers the plurality of light emitting diode chips corresponding to each push pin of the plurality of push pin units to the second substrate at a time,
wherein the push pin module further includes a width varying unit that varies a width between the plurality of push pin units based on an arrangement interval between the light emitting diode chips scanned by the first substrate scanning unit.

2. The transfer apparatus of claim 1, wherein an arrangement interval between the plurality of light emitting diode chips mounted on one surface and an arrangement interval between circuit traces disposed on the second substrate are previously tuned.

3. The transfer apparatus of claim 1, further comprising:
a second substrate scanning unit for scanning a position of a circuit trace disposed on the second substrate.

4. The transfer apparatus of claim 1, wherein the push pin module transfers the light emitting diode chip in which the arrangement position between the light emitting diode chips scanned by the first substrate scanning unit is out of a predetermined range to the second substrate, using one of the plurality of push pin units.

5. The transfer apparatus of claim 1, wherein each of the plurality of push pin units includes a pressure control unit for maintaining a pressure between the light emitting diode chip and the second substrate to be a predetermined pressure.

6. The transfer apparatus of claim 5, wherein the pressure control unit includes at least one of a voice coil motor (VCM) and a spring.

7. The transfer apparatus of claim 1, wherein the push pin module transfers the light emitting diode chip in which the arrangement position between the light emitting diode chips is out of a predetermined range to the second substrate, using one of the plurality of push pin units.

8. A transfer apparatus for transferring a light emitting diode chip, comprising:
   a first substrate having the light emitting diode chip mounted on one surface is placed;
   a work table on which a second substrate to which the light emitting diode chip is to be transferred is placed; and
   a push pin module for transferring the light emitting diode chip to the second substrate by pushing a portion corresponding to the light emitting diode chip from the other surface of the first substrate in a state that one surface of the first substrate and the second substrate are disposed to face each other,
   wherein the push pin module includes a pressure control unit for maintaining a pressure between the light emitting diode chip and the second substrate to be a predetermined pressure,
   wherein the push pin module includes a plurality of push pin units each including a push pin for pushing the other surface of the first substrate, and
   the push pin module transfers a plurality of light emitting diode chips corresponding to each push pin of the plurality of push pin units to the second substrate at a time,
   wherein the push pin module further includes a width varying unit that varies a width between the plurality of push pin units based on an arrangement interval between the light emitting diode chips.

9. The transfer apparatus of claim 8, wherein the pressure control unit includes at least one of a voice coil motor (VCM) and a spring.

10. The transfer apparatus of claim 8, further comprising:
    a second substrate scanning unit for scanning a position of a circuit trace disposed on the second substrate.

11. The transfer apparatus of claim 8, further comprising:
    a first substrate scanning unit for scanning a position of the light emitting diode chip mounted on the first substrate.

* * * * *